United States Patent
Maeyama et al.

(10) Patent No.: US 6,720,084 B2
(45) Date of Patent: Apr. 13, 2004

(54) PROCESS FOR PRODUCING HEAT-RESISTANT RESIN FILM HAVING METALLIC THIN FILM, PROCESS FOR PRODUCING ENDLESS BELT, ENDLESS BELT, AND APPARATUS FOR FORMING IMAGE

(75) Inventors: Ryuichiro Maeyama, Ebina (JP); Yasuhiro Uehara, Ebina (JP); Michiaki Yasuno, Ebina (JP); Makoto Omata, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 129 days.

(21) Appl. No.: 09/866,990

(22) Filed: May 30, 2001

(65) Prior Publication Data

US 2002/0022138 A1 Feb. 21, 2002

(30) Foreign Application Priority Data

Jun. 5, 2000 (JP) ........................................ 2000-167835

(51) Int. Cl.⁷ ........................... B32B 7/00; B32B 27/00; C25D 5/00
(52) U.S. Cl. ................... 428/458; 428/35.8; 428/35.91; 428/411.1; 428/457; 427/230; 427/234; 427/237; 427/240; 427/241; 427/407.1; 427/409; 264/241; 264/299; 264/319; 205/143; 205/144; 205/149; 205/151; 205/152; 205/80; 156/60; 156/137
(58) Field of Search .............................. 428/35.8, 328, 428/458, 457, 36.91, 411.1; 205/152, 143, 144, 149, 151; 427/409, 230, 234, 237, 240, 241, 407.1; 156/60, 137; 264/241, 299, 319

(56) References Cited

U.S. PATENT DOCUMENTS

| | | | | | |
|---|---|---|---|---|---|
| 4,956,053 A | * | 9/1990 | Polan et al. | ............... | 205/138 |
| 5,236,572 A | * | 8/1993 | Lam et al. | ................... | 205/75 |
| 5,290,909 A | * | 3/1994 | Chen et al. | ................. | 528/125 |
| 5,411,765 A | * | 5/1995 | Kanakarajan et al. | .... | 427/385.5 |
| 5,411,779 A | * | 5/1995 | Nakajima et al. | ........ | 428/36.91 |
| 5,703,202 A | * | 12/1997 | Jester et al. | ................ | 438/763 |
| 5,801,729 A | * | 9/1998 | Kitamura et al. | ........... | 347/102 |
| 6,007,918 A | * | 12/1999 | Tan et al. | .................... | 428/451 |
| 6,562,135 B2 | * | 5/2003 | Bush et al. | ................. | 118/407 |
| 2002/0076515 A1 | * | 6/2002 | Maeyama et al. | ......... | 428/35.8 |
| 2003/0121951 A1 | * | 7/2003 | Suzuki et al. | ............... | 228/101 |
| 2003/0132101 A1 | * | 7/2003 | Ikadai et al. | ........... | 204/192.12 |

FOREIGN PATENT DOCUMENTS

| | | | |
|---|---|---|---|
| GB | 2101526 A | * | 1/1983 |
| JP | 61-095361 | * | 5/1986 |
| JP | 5-299820 | | 11/1993 |
| JP | 6-256960 | | 9/1994 |
| JP | 6-316768 | | 11/1994 |
| JP | 7-216225 | | 8/1995 |

OTHER PUBLICATIONS

Merriam–Webster's Collegiate® Dictionary 10$^{th}$ edition, principal copyright 1993 by Merriam–Webster, Incorporated, p. 707, "mandrel or mandril".*

* cited by examiner

Primary Examiner—P. Hampton-Hightower
(74) Attorney, Agent, or Firm—Morgan Lewis & Bockius LLP

(57) ABSTRACT

A heat-resistant resin film having a metallic thin film accumulated thereon or an endless belt having a metallic thin film accumulated thereon having good mechanical characteristics is produced in a simple process. A metallic thin film is formed on an inner surface of a cylindrical substrate, and a layer of a heat-resistant resin is formed thereon. An accumulated body of the heat-resistant resin and the metallic thin film is peeled off from the substrate. The metallic thin film may be formed by electroplating, electroless plating or vapor deposition, or may also be formed by attaching a metallic foil having been prepared on an inner surface of the substrate. The heat-resistant resin layer is formed by injecting a polyamide acid solution in a rotational drum, and then formed by centrifugal forming by rotating the rotational drum on rollers under heating. After forming, imidization is conducted by heating and baking to form a film member of a thermosetting polyimide. The heat-resistant resin layer may be formed by centrifugal forming of a liquid crystal polymer under melting by heating in the rotational drum, or by centrifugal forming of a solution of aromatic polyamide.

24 Claims, 8 Drawing Sheets

PROCESS FOR PRODUCING HEAT-RESISTANT RESIN FILM HAVING METALLIC THIN FILM, PROCESS FOR PRODUCING ENDLESS BELT, ENDLESS BELT, AND APPARATUS FOR FORMING IMAGE

BACKGROUND OF THE INVENTION

1. Field of the Invention

The present invention relates to a process for producing a film member formed of a heat-resistant resin having a metallic thin film accumulated thereon, and also relates to a process for producing an endless belt formed with the film member.

2. Description of the Related Art

A film member formed by accumulating a thin film of an electroconductive metal, such as copper and aluminum, on a thin plate formed by impregnating a thin plate or a core material of a heat-resistant resin with a heat-resistant resin has been widely used as a substrate for a printed circuit. In an image forming apparatus using a dry toner, such as those of an electrophotographic system and an electrostatic recording system, an endless film formed by accumulating a heat-resistant resin and a metallic thin film has been often used as an intermediate transfer member for temporarily carrying a toner image.

The toner image formed by attaching a toner to an electrostatic image is transferred to the intermediate transfer member, and the toner image is heated by electromagnetic induction to be simultaneously transferred and fixed to a recording medium.

Such an image forming apparatus will be roughly described below.

FIG. 7A is a schematic constitutional view of the image forming apparatus, which is a full color laser printer of an electrophotographic system. FIG. 7B is an enlarged view of an important part of the image forming apparatus.

The image forming apparatus has a photosensitive drum 1, on the surface of which a latent image is caused by differences in electrostatic potential, and also has, around the photosensitive drum 1, an exposing part having a charging unit 2 for substantially uniformly charging the surface of the photosensitive drum 1, a laser scanner 3 and a mirror 4 for forming a latent image by irradiating the photosensitive drum 1 with laser light corresponding to respective color signals; a rotational developing unit 5 having toners of four colors, cyan, magenta, yellow and black, for visualizing the latent image on the photosensitive drum with respective color toners; an intermediate transfer member 6 in the form of an endless belt supported to be capable of circulating in one direction; a cleaning unit 7 for cleaning the surface of the photosensitive drum after transferring; and an exposing lamp 8 for static elimination the surface of the photosensitive drum 1.

The intermediate transfer member is hung between a driving roller 10 and a tension imparting member 11, and a pressure roller 12 is provided to face the driving roller 10 to sandwich the intermediate transfer member 6. An electromagnetic induction heating unit 13 for heating the intermediate transfer member 6 is provided on the upstream of the circulating direction of the intermediate transfer member 6 with respect to the position, at which the driving roller 10 faces the pressure roller 12.

The apparatus further has a paper supplying roller 16 and a resist roller 17 for transmitting a recording material contained in a paper supplying unit 15 one by one, and also has a recording material guide 18 for supplying the recording material between the intermediate transfer member 6 and the pressure roller 12.

The electromagnetic induction heating unit 13 has an excitation coil 13 as shown in FIG. 8, and forms an alternating magnetic field penetrating the intermediate transfer member 6. The intermediate transfer member 6 has a substrate layer 6a having accumulated thereon an electroconductive layer (electromagnetic induction heating layer) 6b and a releasing layer 6c having good releasing property, and an eddy current B is formed in the electroconductive layer 6b by the alternating magnetic field. The electroconductive layer 6b is heated by the eddy current to heat and fuse the toner image carried on the surface.

In the image forming apparatus, the toner images of respective colors formed on the photosensitive drum 1 are transferred to overlap one by one on the intermediate transfer member 6 by a bias voltage applied between the photosensitive drum 1 and the driving roller 10, so as to form a full color toner image. The toner image is fused by electromagnetic induction heating of the electroconductive layer 6b of the intermediate transfer member, and accumulated to the recording material to fix thereto by pressure between the pressure roller 12 and the driving roller 10. As a result, the toner image is simultaneously transferred and fixed to the recording material.

The intermediate transfer member 6 is, for example, an endless belt formed by accumulating a copper thin film having a thickness of about from 1 to 50 $\mu$m to a film member formed of a heat-resistant resin, such as thermosetting polyimide, aromatic polyamide (aramid) and a liquid crystal polymer, having a thickness of from 50 to 200 $\mu$m. The liquid crystal polymer exhibits liquid crystalline property in a dissolved state or a molten state, and a thermotropic liquid crystal polymer exhibiting liquid crystalline property in a molten state has excellent properties, such as a high strength, a high heat resistance, a low linear expansion coefficient, a high insulating property, a low hygroscopicity and a high gas barrier property. Therefore, the application thereof is expanding not only to the field using the liquid crystalline property, but also as a mechanical member and fibers.

As described in the foregoing, it has been known that the production of a film member formed by accumulating a metallic thin film and a layer of a heat-resistant resin is conducted by a method, in which a film of a heat-resistant resin and a metallic foil are attached to each other with an adhesive, and a method, in which a metallic thin film is formed on a film of a heat-resistant resin by electroplating, electroless plating or vapor deposition.

However, in the method of attaching with an adhesive, the reliability in adhesive force is poor when the metallic thin film is repeatedly subjected to electromagnetic induction heating.

In the method of forming a metallic thin film on a heat-resistant resin, it is generally difficult to firmly attach a metallic thin film, such as copper, to a heat-resistant resin, such as polyimide and aromatic polyamide (aramid). Therefore, techniques for improving the adhesiveness have been proposed, and for example, JP-A-5-299820 proposes a technique, in which a metallic vapor deposition film is formed on polyimide, and then an electron beam heating vapor deposition copper layer and an electroplating copper layer are consecutively accumulated thereto.

JP-A-6-316768 discloses a technique, in which fluorine is contained in polyimide, and in order to make the fluorine function as adhesive sites, the first step etching treatment is conducted by using an aqueous solution containing hydrazine, and the second step etching treatment is conducted with naphthalene-l-sodium, so as to make copper be liable to attach thereto. JP-A-7-216225 discloses a technique, in which the adhesiveness of a plating metallic film by previously mixing metallic powder in a polyimide precursor is improved.

As for the case where the heat-resistant resin is aromatic polyamide (aramid), JP-A-6-256960 proposes a technique, in which the resin is subjected to an etching treatment with an aqueous solution containing hydrazine and an alkali metal hydroxide, and then a catalyst imparting treatment for electroless plating is conducted.

However, in the conventional techniques, in which a metallic thin film is formed after molding the heat-resistant resin, sufficient adhesiveness cannot be obtained, and the production process cannot be simplified.

In the case a liquid crystal polymer is used as the heat-resistant resin, on the other hand, a film form resin can be directly heat-fused with a metallic foil, but in general, the film member of the liquid crystal polymer is strongly oriented on molding and is liable to split off in one direction.

SUMMARY OF THE INVENTION

The invention has been made in view of the foregoing circumstances and is to provide a process for producing, in simple procedures, a heat-resistant resin film having a metallic thin film accumulated thereto and an endless belt of a heat-resistant resin having a metallic thin film accumulated thereto that are excellent in mechanical characteristics.

According to an aspect of the invention, the process for producing a heat-resistant resin film having a metallic thin film contains the steps of: coating a substrate with a releasing agent; forming a metallic thin film thereon; forming a layer containing a heat-resistant resin thereon; and peeling an accumulated body containing the heat-resistant resin and the metallic thin film from the substrate.

According to another aspect of the invention, the process for producing an endless belt having a metallic thin film contains the steps of: forming a metallic thin film on an inner surface of a cylindrical substrate; forming a layer containing a heat-resistant resin thereon; and peeling an accumulated body containing the heat-resistant resin and the metallic thin film from the substrate.

It is preferred in the invention that the step of forming the layer of a heat-resistant resin contains the steps of: placing a polyamide acid solution in an interior of the cylindrical substrate; rotating the cylindrical substrate in a circumferential direction to make the solution be a layer on the metallic thin film; and subjecting the solution to imidization by heating to form a film member containing polyimide.

The invention also provides, as another aspect, an endless belt having a metallic thin film produced by such a process that contains the steps of: forming a metallic thin film on an inner surface of a cylindrical substrate; forming a layer containing a heat-resistant resin thereon; and peeling an accumulated body containing the heat-resistant resin and the metallic thin film from the substrate.

The invention also provides, as another aspect, an endless cylindrical belt having a metallic thin film containing a layer containing a heat-resistant resin on an inner surface of the metallic thin film, the metallic thin film being a metallic foil, the metallic thin film having a junction of joining both ends of the metallic thin film, and the layer of a heat-resistant resin having no junction.

The invention also provides, as another aspect, an apparatus for forming an image containing: an image carrier, in which a latent image caused by differences in electrostatic potential is formed on an endless surface thereof; a developing unit visualizing the latent image by attaching toner powder containing a thermoplastic resin to the image carrier; an intermediate transfer member, on which a toner image formed on the image carrier is temporarily transferred; and a transferring and fixing unit heating the toner image on the intermediate transfer member and press-fixing the molten toner image on a recording medium, wherein the intermediate transfer member is an endless belt described above, and the transferring and fixing unit contains an electromagnetic induction coil arranged to face the intermediate transfer member.

BRIEF DESCRIPTION OF THE DRAWINGS

Preferred embodiments of the invention will be described in detail based on the following figures, wherein.

DESCRIPTION OF THE PREFERRED EMBODIMENTS

Preferred embodiments of the invention will be described below.

A process for producing an endless belt formed by accumulating a copper thin film formed by electroplating and a film member of thermosetting polyimide will be described.

Figure 1:
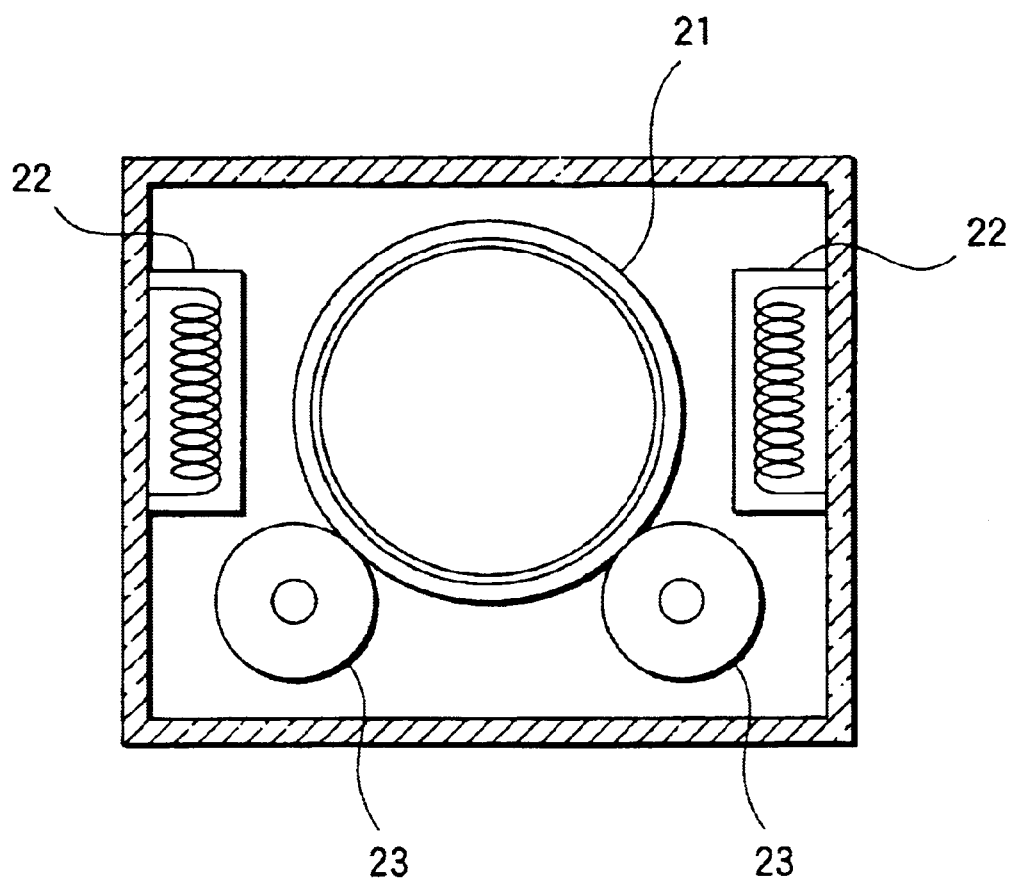
FIG. 1 is a schematic constitutional view showing a centrifugal molding apparatus used in the process for producing an endless belt according to the invention.

The process uses a centrifugal molding apparatus, and the centrifugal molding apparatus has, as shown in FIG. 1, a rotational drum 21 having desired width and inner diameter, a unit 22 for heating the rotational drum, and a unit for rotationally driving the rotational drum in the circumferential direction.

The rotational drum 21 has an inner surface having been sufficiently mirror finished and is opened at both ends thereof, and a ring frame having a prescribed height on both edges of the inner surface for preventing outflow of a liquid.

Units for rotationally driving the rotational drum are two rollers 23 and 23 supported in parallel to each other, on which the rotational drum 21 is placed, and one or two of the rollers 23 and 23 are rotationally driven to rotate the rotational drum 21. The apparatus has such a simple structure that the rotational drum 21 can be easily taken out, and operations, such as formation of a releasing layer, plating, and peeling of the film member thus formed, can be easily conducted.

The inner surface of the rotational drum 21 is immersed in a 2 g/L solution of carboxylbenzotriazole (CBTA) at 30° C. for 30 seconds and taken out, followed by washing with water. Thus, a releasing layer is formed. In order to immerse in the solution, parts where no releasing layer is required, such as the outer surface of the rotational drum, are masked, and the drum is immersed in a bath containing the solution.

Copper plating is then formed on the surface of the resulting organic releasing layer. A copper layer having a thickness of 1 µm is deposited by cathode electrolysis at an electric current density of 3 A/dm$^2$ using a pyrophosphate copper plating bath containing 17 g/L of copper and 500 g/L of potassium pyrophosphate having pH of 8.5 at a bath temperature of 50° C. Furthermore, after washing the surface of the resulting thin copper foil with water, cathode electrolysis is conducted by using a copper sulfate plating bath containing 80 g/L of copper and 150 g/L of sulfuric acid at a bath temperature of 50° C. and an electric current density of 60 A/dm$^2$ to deposit a copper layer of 4 µm, whereby a copper thin layer having a thickness of 5 µm in total is formed. Before forming the layer of a heat-resistant resin, the surface of the metallic thin film is subjected to a chemical etching treatment.

The chemical etching treatment is to roughen the surface of the metallic layer, and known materials capable of dissolving the metal can be employed corresponding to the material of the metallic thin film.

The surface of the metallic thin film is subjected to the chemical etching to roughen the surface to have such a state that the layer of a heat-resistant resin is liable to attach, and therefore the metallic thin film and the layer of a heat-resistant resin formed on the metallic thin film are firmly integrated.

In the thermosetting polyimide to be accumulated on the copper foil layer, an imide group is connected to an organic group in the main chain thereof, and the combination forms a repeating unit constituting the polymer. The organic group includes an aliphatic group and an aromatic group, and an aromatic group, such as a phenyl group, a naphthyl group and a diphenyl group (including those obtained by combining two phenyl groups via a methylene group or a carbonyl group), is preferred since reduction in mechanical characteristics on using at a high temperature can be prevented. The thermosetting polyimide is generally produced by the following method. A tetracarboxylic dianhydride, such as pyromellitic dianhydride, 2,2',3,3'-biphenyltetracaboxylic dianhydride, 3,3',4,4'-benzophenonetetracaboxylic dianhydride and bis(2,3-dicarboxyphenyl)methanoic dianhydride, and the equivalent amount of an organic diamine, such as p-phenylenediamine, 4,4'-diaminodiphenylmethane and 4,4'-diaminodiphenylether, are subjected to a condensation polymerization reaction in an organic polar solvent, such as dimethylacetamide and N-methylpyrrolidone, at a low temperature lower than ordinary temperature, so as to form a polyamide acid solution. The solution is dried and molded, followed by baking, to obtain thermosetting polyimide.

In order to form a layer of the thermosetting polyimide on the copper thin layer, i.e., on the inner surface of the rotational drum, a prescribed amount of the polyamide acid solution (including those added with thermal conductive powder and electroconductive powder) for obtaining a film having a prescribed thickness is injected into the rotational drum, which is slowly rotated, at ordinary temperature. After completing the injection of the prescribed amount, the rotation of the drum is gradually accelerated to reach the necessary rotation number, and then the entire drum is gradually heated to reach the prescribed temperature, followed by maintaining the rotation number for a prescribed period of time. While the various conditions, such as the prescribed period of time slightly vary depending the factors, such as the kind of the solution, the concentration of the solution and the desired thickness of the film, it is generally preferred from the standpoint of the nature of the film, the accuracy of deviation in thickness and prevention of bubbles that the optimum conditions are selected from such ranges that the prescribed period of time is from 10 to 60 minutes, the rotation number is from 500 to 2,000 rpm, and the temperature of the drum is from 80 to 200° C.

The polyamide acid solution (including those added with thermal conductive powder and electroconductive powder) has a viscosity of from 10 to 1,000 cps, and preferably from 20 to 200 cps. When the viscosity is less than 10 cps, the dispersion of fluorine series resin fine particles (as well as thermal conductive powder and electroconductive powder) in the solution may be poor to cause aggregation and precipitation. When it exceeds 1,000 cps, the accuracy in film thickness of the resulting polyamide acid seamless tubular film becomes poor. In order to efficiently obtain gradient dispersion of the fluorine series resin fine particles and the thermal conductive powder in the thickness direction of the endless film, the viscosity is particularly preferably in the range of from 50 to 170 cps.

The heating unit for the rotational drum is not particularly limited, and it is preferred to use such a heating unit capable of controlling the temperature containing the entire drum as shown in FIG. 1 since the drum can be uniformly heated.

The both ends of the rotational drum are opened, from which the solvent evaporated by the heating operation dissipates.

After lapsing the prescribed period of time under the heating, the heating operation is terminated, and the rotation is terminated when the entire is cooled to ordinary temperature. The molded article is then taken out from the interior of the drum. The resulting molded article is an endless film of polyamide acid containing a slight amount of remaining solvent, on which a copper foil is attached.

A compression force may be applied to the resulting accumulated body of the copper foil and the liquid crystal polymer for increasing the adhesive force between them. The operation can be conducted in the following manner.

Figure 6:
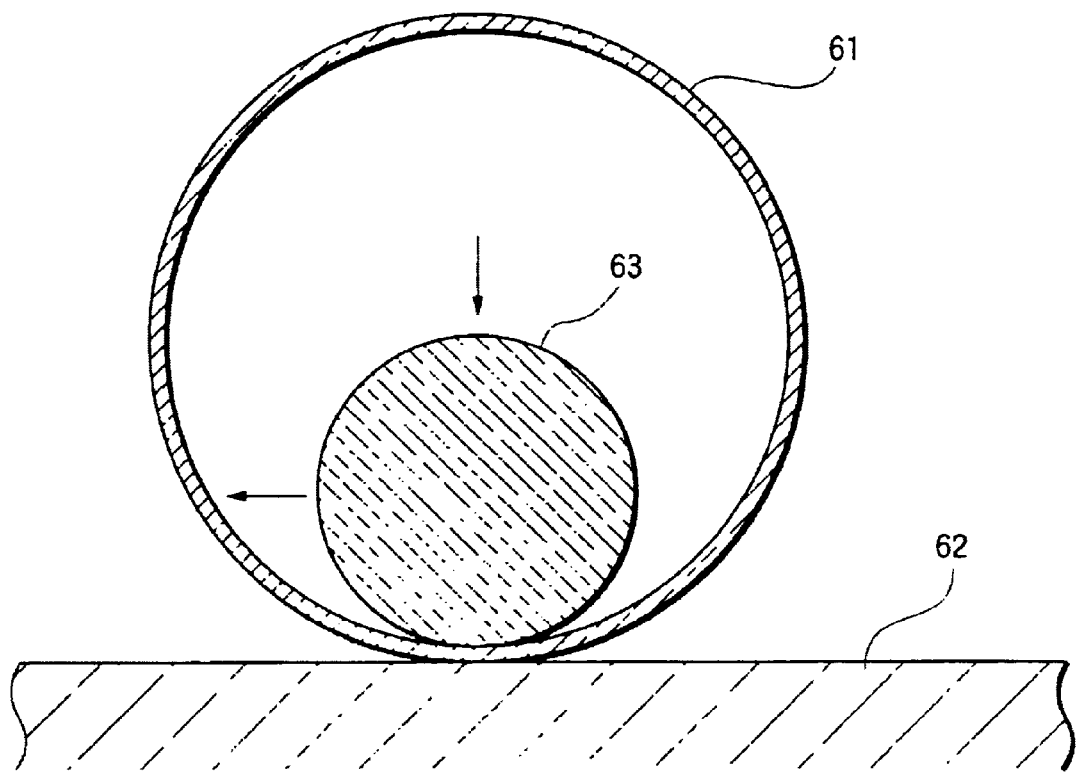
FIG. 6 is a schematic diagram showing an example of a method for applying pressure to an accumulated body of a metallic thin film and a heat-resistant resin.

As shown in FIG. 6, the endless belt 61 is placed on a flat substrate 62 having a mirror polished surface, and a steel roll 63 is inserted thereinto. The steel roll 63 is rotated while it is strongly compressed on the substrate 62. The adhesive force between the copper foil and the liquid crystal polymer layer is increased by applying pressure in such a manner, so as to improve the integrated state thereof.

The endless film of polyamide acid is then placed in a hot air dryer, which is increased to a prescribed temperature, and the endless film is continuously heated at that temperature for a prescribed period of time. The temperature is preferably from 350 to 500° C., and the period of time is preferably from 3 to 30 minutes. After completing the heating for the prescribed period of time, the heating is terminated, and the endless film is taken out after cooling to ordinary temperature. Thus, the remaining solvent can be completely removed, whereby an endless film of thermosetting polyimide having a copper thin layer can be obtained.

The step of heating the endless film of polyamide acid taken out from the rotational drum can also be conducted by electromagnetic induction.

Figure 2A:
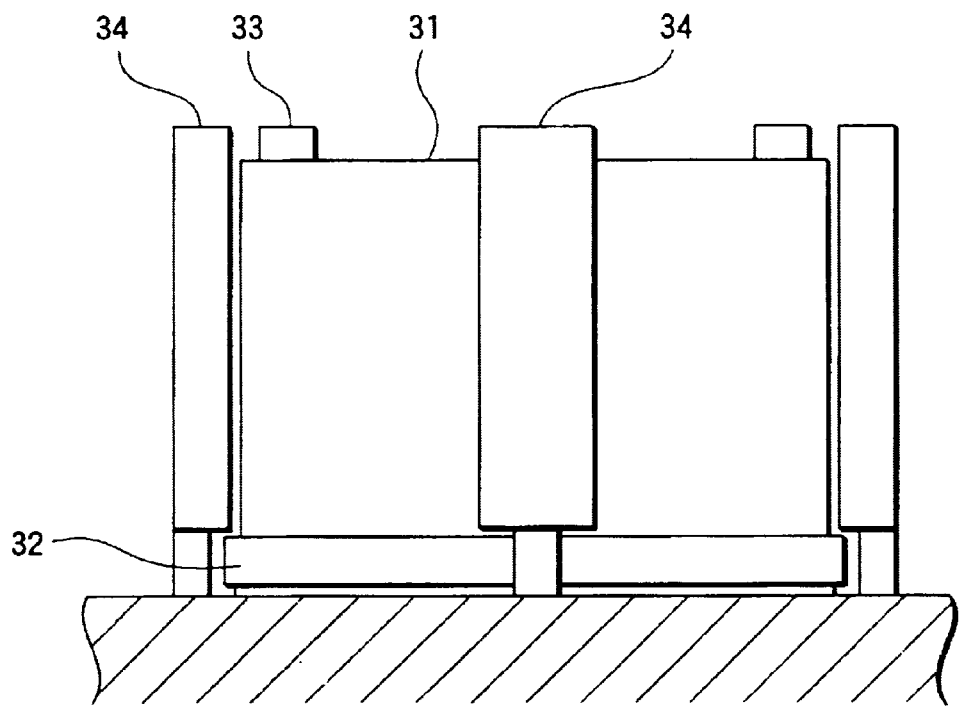
FIGS. 2A and 2B are a schematic side view and a schematic plane view showing a method for heating an endless film taken out from a rotational drum.
Figure 2B:
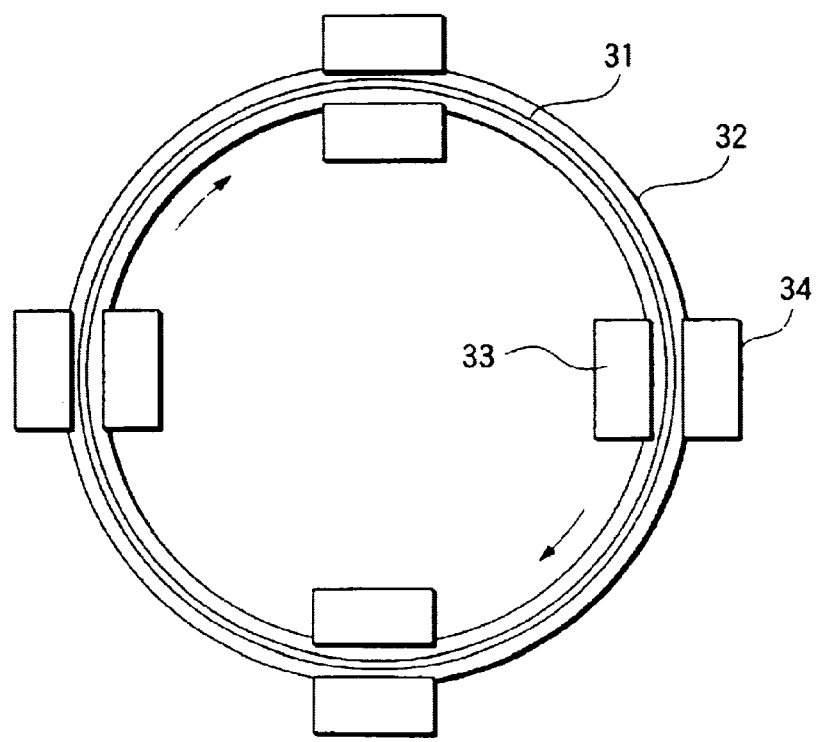

As shown in FIGS. 2A and 2B, the endless film 31 is placed on a rotating platform 32 with the axis of the endless belt being vertical. Excitation coils are arranged to face each other on the inner and outer surfaces of the endless film.

Figure 3:
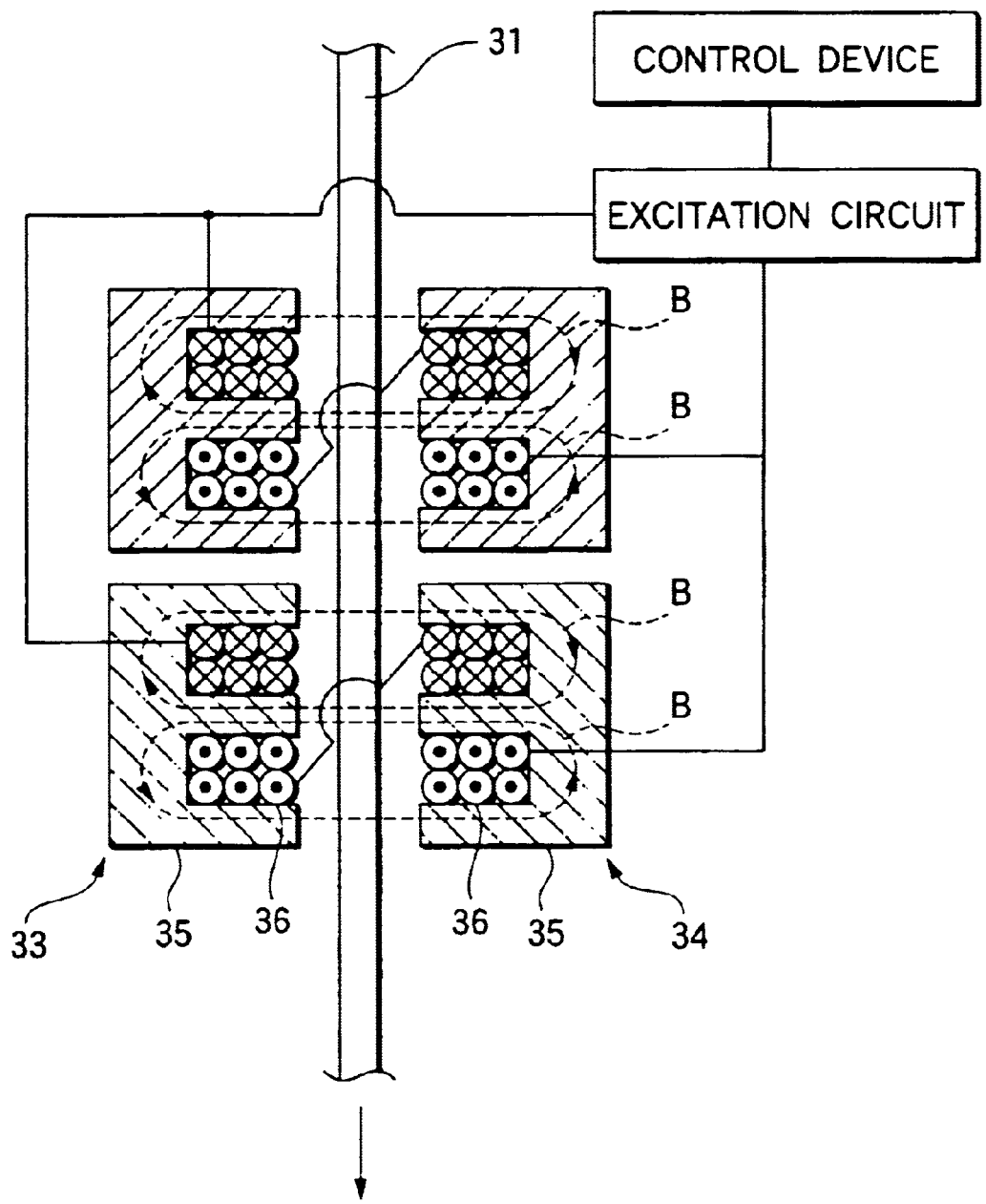
FIG. 3 is a schematic diagram of an induction coil.

The excitation coils 33 and 34 each has a core 35 having a wire 36 would thereon as shown in FIG. 3, and when an alternating electric current is supplied thereto from an excitation circuit, a magnetic flux B is generated to penetrate the endless film 31. An eddy current is thus formed in the copper thin film, which is heated thereby. The rotating platform 32 is driven to rotate at a peripheral velocity of about 50 mm/sec to substantially uniformly heat the film of polyamide acid, so as to cause imidization.

In the foregoing method, heating necessary for drying and imidization of the molded article of polyamide acid is conducted by utilizing development of heat by the eddy current. Because the metallic thin film that is closely attached to the film molded article of polyamide acid develops heat, good heat efficiency can be obtained to eliminate excessive heating equipments. Thus, the operation efficiency can be improved.

The electromagnetic induction heating can be conducted under the state where the molded article of polyamide acid is still in the rotational drum, but it is desirably conducted after taking out from the rotational drum.

Before injecting the polyamide acid solution into the rotational drum in the foregoing process, it is possible that a porous film of a fluorine resin or a nonwoven fabric of a heat-resistant resin is attached to the inner surface of the rotational drum. The film of a porous fluorine resin has uniform continuous pores of an order of micrometers and has heat resistance. Specific examples that can be used as the fluorine resin include polytetrafluoroethylene, a tetrafluoroethylene-hexafluoropropylene copolymer, polyvinyl fluoride, polyvinylidene fluoride and polyethylene chloride trifluoride, and polytetrafluoroethylene is preferred. For example, a film of a porous fluorine resin containing polytetrafluoroethylene may have an average pore diameter of from 0.05 to 5.0 µm, and preferably from 0.2 to 1.0 µm, a porosity of from 40 to 95%, and preferably from 60 to 85%, and a thickness of from 5 to 300 µm, and preferably from 20 to 150 µm. Herein, a film having been stretched and having an average pore diameter of 0.5 µm, a porosity of 80% and a thickness of 50 µm may be used. The nonwoven fabric that can be used may contain fibers of a meta-type aromatic polyamide having a fiber diameter of 8.5 µm, a fiber length of 38 mm and a circular cross section, and may have an area density of 25 gm², a thickness of 50 µm and an apparent density of 0.71 g/cm³. When the film or the nonwoven fabric is used, the polyamide acid solution penetrates in the pores of the film or the fibers of the nonwoven fabric and is subjected to imidization in such a state that the solution is integrated with the film or the nonwoven fabric. As a result, an endless belt having the porous film or the nonwoven fabric as a core material is produced, and thus the mechanical properties are improved.

After forming the accumulated body of the copper thin film and the layer of thermosetting polyimide, it is possible that a layer of thermosetting polyimide may be formed on the outer surface of the accumulated body. In order to form a layer of thermosetting polyimide on the outer surface, coating of the polyamide acid solution is applied on the outer surface and heated, for example, by a hot air dryer, to conduct imidization.

When a layer of a heat-resistant resin is formed on the outer surface of the endless belt, folds and breakage of the endless belt can be prevented. When an appropriate amount of electroconductive powder is mixed in the layer of a heat-resistant resin, the electric resistivity of the outer surface can be adjusted. The layer also functions as a protective layer of the metallic thin film.

An embodiment of the invention will be described below, in which the metallic thin film is the formed with a copper foil formed by electroplating, electroless plating or rolling, and the layer of a heat-resistant resin is formed with a thermotropic liquid crystal polymer.

Figure 4:
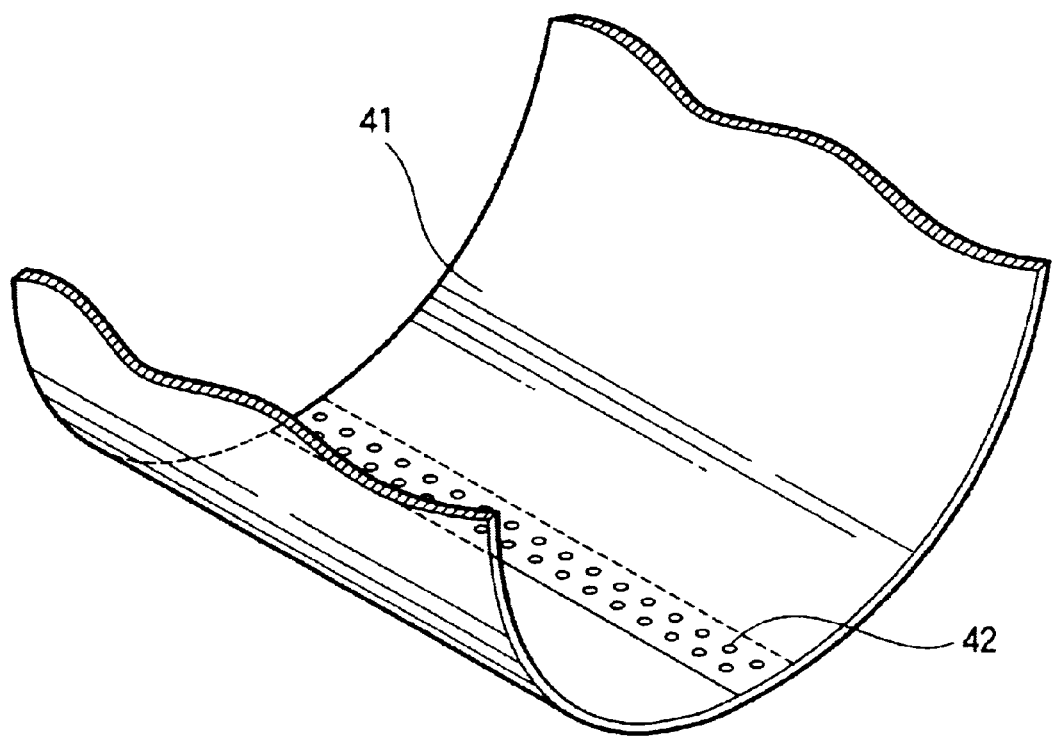
FIG. 4 is a schematic perspective view showing through holes provided at a junction of a copper foil upon forming a metallic thin film with a copper foil.

As a rotational drum, that having the same structure as the foregoing embodiment is used. A copper foil is attached to the inner surface of the rotational drum. In order to attach the copper foil that has been previously prepared on the entire inner surface of the endless form, a junction is necessarily employed. As shown in FIG. 4, the junction is formed by overlapping the copper foils 41, and a number of through holes 42 penetrating the copper foils are formed in the overlapping part. Coating of an electroconductive paste as an electric junction aid may also be applied on the overlapping part. As the electroconductive paste, those obtained by mixing a silicone resin with fine powder of copper, silver or aluminum can be used. A copper foil having a peeling layer, e.g., 5µ Micro Thin Film produced by Mitsui Metal & Mining Co., Ltd., may also be used instead of the copper foil.

The thermotropic liquid crystal polymer forming the layer of a heat-resistant resin is a polymer exhibiting a liquid crystal property in a molten state, and examples thereof include completely aromatic polyester, aromatic aliphatic polyester, aromatic polyazomethine and aromatic polyester carbonate.

The completely aromatic polyester means that respective parts present in the polyester each has at least one aromatic ring on the polymer main chain (backbone). Examples of the completely aromatic polyester include a first type formed from parahydroxybenzoic acid (PHB), terephthalic acid and biphenol represented by the following formula (I), a second type formed from PHB and 2,6-hydroxynaphthoic acid represented by the following formula (II), and a third type formed from PHB, terephthalic acid and ethylene glycol represented by the following formula (III).

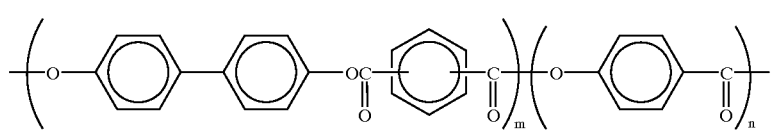

(I)

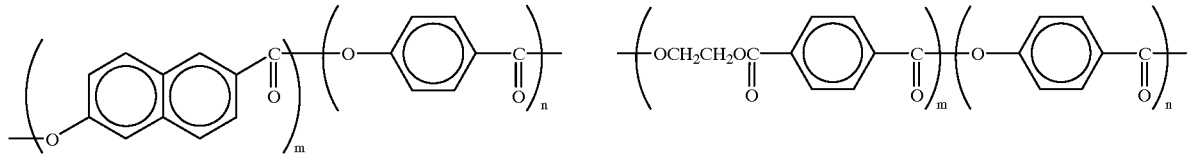

Examples of the aromatic aliphatic polyester include a copolymer of polyethyleneterephthalate and hydroxybenzoic acid.

Examples of the aromatic polyazometine include poly(nitrilo-2-methyl-1,4-phenylenenitriloethylidyne-1,4-phenyleneethylidine), poly(nitrilo-2-methyl-1,4-phenylenenitrolomethylidyne-1,4-phenylenemethylidine) and poly(nitrilo-2-chloro-1,4-phenylenenitrilomethylidine-1,4-phenylenemethylidine).

Examples of the aromatic polyester polycarbonate include those substantially derived from a hydroxybenzoic acid unit, a hydroquinone unit, a carbonate unit and an aromatic carboxylic acid unit.

The thermotropic liquid crystal polymer may be placed in the interior of the substrate after melting by heat, or in alternative, may be placed in the interior of the substrate in the form of powder or pellets, followed by melting by heat. The liquid crystal polymer in the molten state is formed into a layer having a uniform thickness on the inner surface of the substrate by rotationally driving the cylindrical substrate in the circumferential direction. After cooling the same, an endless film member of the liquid crystal polymer is formed and firmly united with the metallic thin film having been formed.

When a thermotropic liquid crystal polymer in a molten state is molded by extruding from a die, the molecules thereof are considerably oriented in the direction of extrusion to cause anisotropy, and thus the resulting film member has such a nature that it is liable to split in the extrusion direction. However, the anisotropy can be avoided by molding by centrifuging as described in the foregoing.

Herein, 27% by mol of 6-hydroxy-2-naphthoic acid unit and 73% by mol of p-hydroxybenzoic acid unit are kneaded under heating to form pellets, which is used as the thermotropic liquid crystal polymer for forming the layer of a heat-resistant resin. The liquid crystal polymer has a melting point of 280° C. A suitable amount of the pellets is placed in the rotational drum having a copper foil attached, and the rotational drum is rotationally driven at from 500 to 2,000 rpm under heating to a temperature of from 280 to 300° C. After the pellets are sufficiently melted to form a uniform layer on the inner surface of the rotational drum by centrifugal force, heating is terminated to cool to ordinary temperature. After cooling, the resulting film member is taken out by peeling off from the rotational drum.

The heating operation may be conducted by arranging heating elements around the rotational drum that is rotationally driven as shown in FIG. 1, and also may be conducted by electromagnetic induction.

Figure 5:
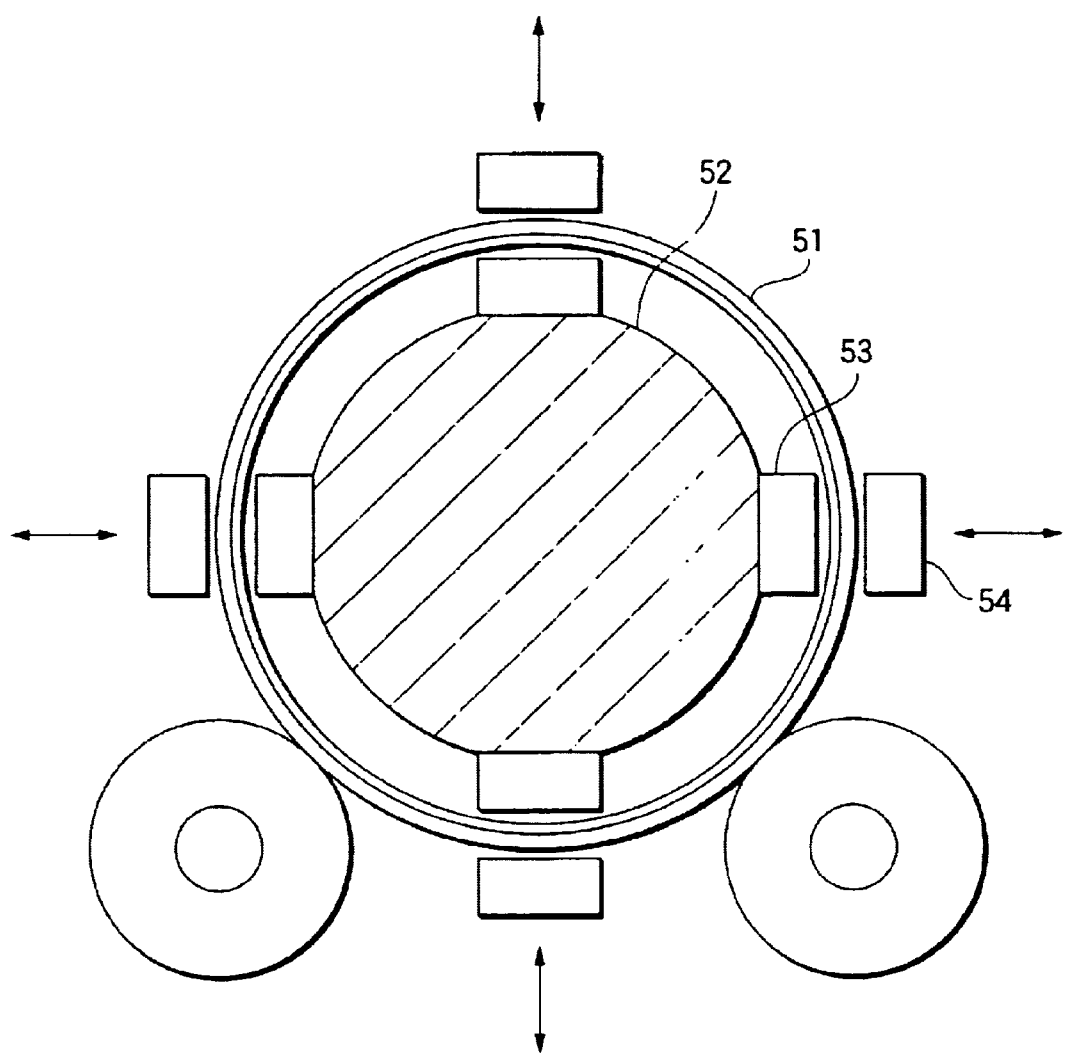
FIG. 5 is a schematic diagram showing a method for heating, by electromagnetic induction, a polymer in a rotational drum that is rotationally driven.

As shown in FIG. 5, a coil supporting member 52 is inserted into a rotational drum 51 rotationally supported from one end thereof, and excitation coils 53 are supported and retained thereby to face the inner surface of the rotational drum 51 without contact. The similar excitation coils 54 are also arranged outside the rotational drum 51 facing thereto. The outside excitation coils 54 are movable to make the rotational drum 51 be detachable.

As the excitation coils 53 and 54, one shown in FIG. 3 can be used. When an alternating current is supplied thereto from an excitation circuit, a magnetic flux is formed to penetrate the rotational drum 51, and thus an eddy current is formed in the copper thin film formed on the inner surface of the rotational drum, whereby the rotational drum is heated. By rotationally driving the rotational drum 51 at this time, the liquid crystal polymer is melted by heating, and a layer thereof is formed.

The heating can be conducted with extremely high efficiency because the liquid crystal polymer to be heated is in direct contact with the metallic thin film developing heat, and the metallic thin film has a small heat capacity owing to its small thickness.

In the case where such a heating operation is employed, the material of the rotational drum is preferably a nonmagnetic material, such as ceramics. In the case where the metallic thin film is formed on the inner surface of the rotational drum by electroplating, one having a metallic layer, such as stainless steel, may also be used.

In the foregoing process, a porous film of a fluorine resin or a nonwoven fabric of a heat-resistant resin may be attached to the inner surface of the rotational drum before placing the pellets of the thermotropic liquid crystal polymer into the rotational drum. According to the procedure, the molten polymer penetrates in the pores of the porous film or the fibers to form a film member as integrated therewith by heating as well as centrifugal force in rotating the rotational drum. As the porous film of a fluorine resin and the nonwoven fabric of a heat-resistant resin, those described for the foregoing examples may be employed.

A compression force may be applied to the thus formed accumulated body of the copper foil and the liquid crystal polymer to increase the adhesion force therebetween. The application of a compression force can be conducted in the following manner. As shown in FIG. 6, the endless belt 61 is placed on a flat substrate 62 having a mirror polished surface, and a steel roll 63 is inserted thereinto. The steel roll 63 is rotated while it is strongly compressed on the substrate 62. The adhesive force between the copper foil and the liquid crystal polymer layer is increased by applying pressure in such a manner, so as to improve the integrated state thereof.

It is possible that a polymer layer may further be formed on the outer surface of the accumulated body of the copper foil and the thermotropic liquid crystal polymer. In order to form the polymer layer on the outer surface, since it is difficult to use a thermoplastic polymer, such as a thermotropic liquid crystal polymer, the following methods are preferably employed, i.e., a method, in which coating of a polyamide acid solution is applied to form a layer, which is then subjected to imidization to form a polyimide layer, or a method, in which the layer is formed from a solution as similar to the case of an aromatic polyamide described later.

Figure 7A:
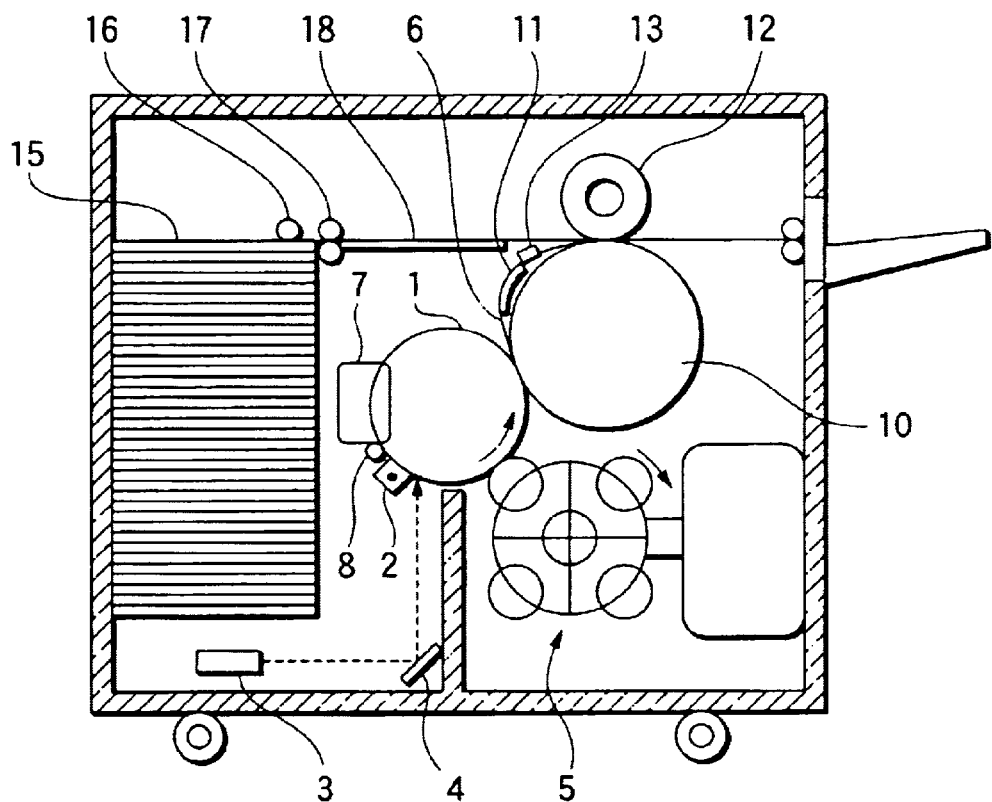
FIG. 7A is a schematic constitutional view showing an apparatus for forming an image using an endless belt produced by the process of the invention.
Figure 7B:
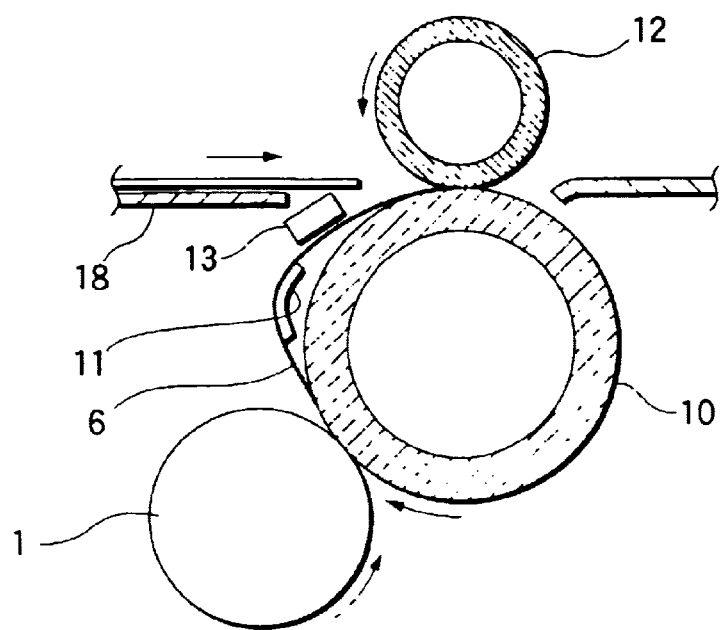
FIG. 7B is an enlarged view showing an important part thereof.
Figure 8:
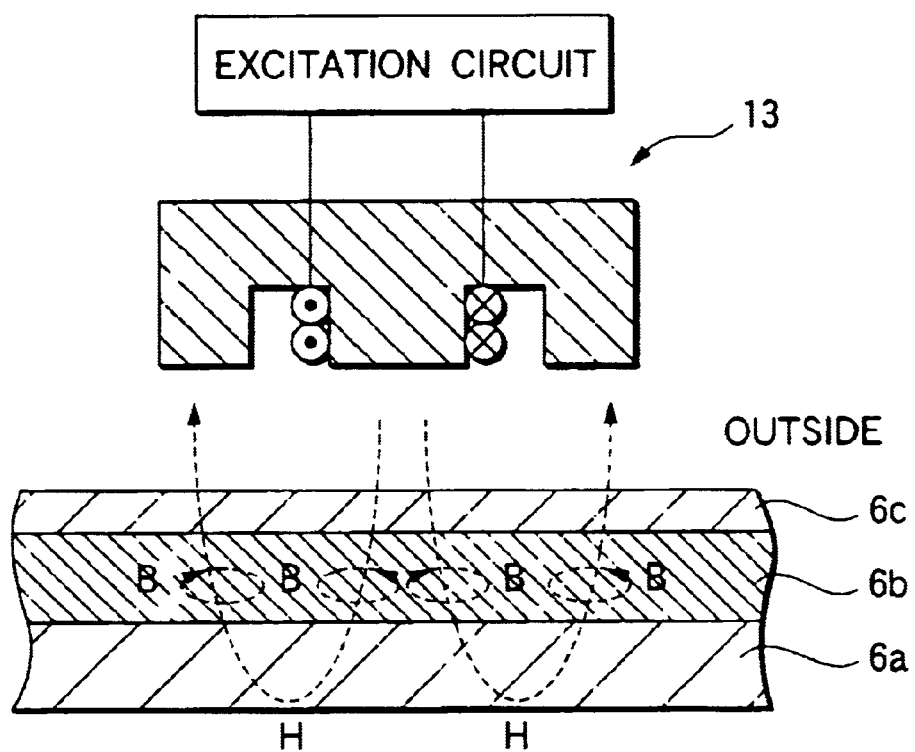
FIG. 8 is a schematic diagram showing an apparatus and a principal for heating the endless belt having a metallic thin film by electromagnetic induction in the apparatus for forming an image shown in FIG. 7.

When the endless belt thus formed is used as an intermediate transfer member in an apparatus for forming an image shown in FIG. 7, it is desirable that a surface layer formed with a fluorine resin having good releasing property is formed on the outer surface thereof, or in alternative, an elastic layer formed with silicone rubber is firstly formed, followed by forming the surface layer.

A process for producing an endless belt using aromatic polyamide (aramid) as the heat-resistant resin layer will be described below.

The aromatic polyamide (aramid) preferably contains 50% by mol or more, preferably 70% by mol or more, of a repeating unit represented by the following general formula (I) and/or a repeating unit represented by the following general formula (II):

(I)

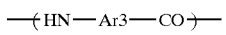
(II)

wherein $Ar_1$, $Ar_2$ and $Ar_3$ each represents the following (a), (b), (c), (d) or (e);

(a)

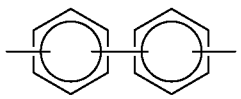
(b)

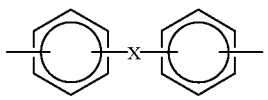
(c)

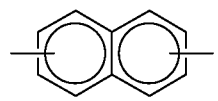
(d)

(e)

X and Y are selected from —O—, —CH$_2$—, —CO—, —SO$_2$—, —S— and —C(CH$_3$)$_2$—, but they are not limited thereto. Furthermore, part of the hydrogen atoms on the aromatic rings may be substituted by a halogen atom, a nitro group, an alkyl group having from 1 to 3 carbon atoms or an alkoxy group having from 1 to 3 carbon atoms, and the substituent is preferably a chlorine atom and/or a methyl group. The hydrogen atoms in the amide bond constituting the polymer may be substituted by other substituents.

Among the foregoing aromatic rings, such aromatic polyamide is preferred that 50% or more of the entire aromatic rings are bonded at the para-position because a film having a high elastic modulus, and such aromatic polyamide is more preferred that 70% or more of the entire aromatic rings are bonded at the para-position.

It is preferred that aromatic rings having a halogen atom substituting part of the hydrogen atoms on the aromatic ring are contained at 30% or more, more preferably 50% or more, of the entire aromatic rings because a hygroscopic expansion coefficient becomes small.

The solvent used in the invention is not particularly limited as far as the polymer is dissolved therein, and examples thereof include methylene chloride, methyl alcohol, water, ethylene glycol, metacresol, N-methylpirrolidone, sulfuric acid and dimethylacetamide.

The polymer concentration of the polymer solution in the invention is not particularly limited as varied depending on the kind of the polymer, and it is generally from 4 to 40% by weight.

Furthermore, the polymer solution in the invention may contain, in addition to the polymer and the solvent, a lubricant, a plasticizer, electroconductive particles, an antioxidant and other additives depending on the purpose.

According to the process, a film member of aromatic polyamide having a metallic thin film firmly attached thereto can be easily formed by conducting elimination of the solvent under such a state that the polymer solution is in contact with the metallic thin film. In this example, the same rotational drum as in the foregoing examples can be used, and electroplating or electroless plating can be conducted on the inner surface of the cylindrical substrate.

According to the process, a metallic thin film having no junction can be easily formed on the inner surface of the substrate. The metallic thin film can be formed with a substantially uniform thickness over the entire inner surface of the substrate. The metallic thin film can be formed with a copper foil as similar to the foregoing examples, and herein an embodiment using a copper film will be described.

After attaching a copper foil on the inner surface of a rotational drum as similar to the foregoing examples, a solution of aromatic polyamide is poured into the interior of the rotational drum and is formed into a layer having a uniform thickness of about 100 μm by rotationally driving the rotational drum. The solution is a 10% by weight solution, using N-methyl-2-pyrrolidone as a solvent, of a product that is obtained by neutralizing a reaction product of 85% by mol equivalent of 2-chloro-p-phenylenediamine, 15% by mol equivalent of 4,4'-diaminodiphenylether and 99% by mol equivalent of 2-chloroterephthalic acid dichloride with lithium hydroxide.

In this process, since a metallic foil having been prepared separately from the substrate is attached to the inner surface of the substrate closely in contact therewith to form the metallic thin film, the production equipment can be simplified, and the production cost can be reduced. The metallic foil may be produced by any method, such as an electrolytic foil, an electroless foil, a rolling foil and a beaten foil.

The process for producing an endless belt includes a step of forming a junction of the metallic foil formed by overlapping the foil, and forming plural holes on one or both plies of the overlapping part.

A junction is necessary when a metallic foil having been prepared separately from the substrate is attached on the entire inner surface of the cylindrical substrate. The metallic foil is overlapped at the junction, and the holes are formed therein, whereby the heat-resistant resin penetrates between the overlapping metallic foils to certainly integrate the metallic foil and the heat-resistant resin layer at the junction. In the case where a layer of a heat-resistant resin is formed on the outside of the endless belt, the holes are formed to penetrate through both the overlapping metallic foils, whereby the three layers, i.e., the metallic foil and the heat-resistant resin layers on both sides thereof, can be highly integrated.

The process for producing an endless belt having a metallic thin film may contain such a step that an electric junction aid in the form of an electroconductive paste is inserted between the overlapping metallic foils.

According to this step, the junction of the metallic foil can certainly have electroconductivity by the electric junction aid. Therefore, the endless belt can be an electrically uniform member.

The process for producing an endless belt can have such a step that a heat-resistant resin layer is formed on the outer surface of the accumulated body of the metallic thin film and the heat-resistant resin peeled off from the substrate.

According to this step, a layer of a heat-resistant resin is formed also on the outer surface to protect the metallic thin film, and at the same time, the electric resistivity of the outer surface can be adjusted by mixing fine powder of an electroconductive material in a polymer solution for forming the outside heat-resistant resin layer.

When the endless belt is used as an intermediate transfer member of an apparatus for forming an image shown in FIG. 7, the electric resistivity of the outside surface layer of the endless belt is desirably adjusted to an appropriate value upon conducting electrostatic transfer as primary transfer.

As described in the foregoing, the rotational drum and the solution are heated in such a state that the uniform layer of aromatic polyamide is formed, so as to evaporate the solvent, whereby an endless film member of aromatic polyamide is obtained. The heating can be conducted by arranging heating elements around the rotational drum that is rotationally driven as shown in FIG. 1, or by using excitation coils shown in FIG. 5 to conduct electromagnetic induction heating.

Before injecting the solution into the rotational drum, it is possible that a porous film of a fluorine resin or a nonwoven fabric of a heat-resistant resin is attached to the inner surface of the rotational drum. According to the procedure, the solution penetrates in the pores of the porous film or the fibers of the nonwoven fabric to integratedly form the film member with centrifugal force generated by rotating the rotational drum. As the porous film of a fluorine resin and the nonwoven fabric of a heat-resistant resin, those described for the foregoing examples can be used.

The accumulated body produced in this example may also be subjected to application of pressure by a steel roller as similar to those produced in the foregoing examples. It may also have a polymer layer of polyimide or aromatic polyamide on the outer surface thereof.

While the foregoing examples are those forming a copper thin layer and a heat-resistant resin layer on the inner surface of a rotational drum, a heat-resistant film of non-endless form may be formed on the outer surface of a flat substrate or a drum substrate. In this case, a metallic thin film is formed on the outer surface of a flat substrate or a drum substrate by electroplating, electroless plating or attaching a metallic foil. A releasing agent may be used at this time as similar to the foregoing examples.

The heat-resistant resin layer may be formed in the following manner. For example, coating of a polyamide acid solution is applied on the metallic thin film to form a polymer layer, and then removal or the solvent and imidization by heating are conducted, so as to form the heat-resistant resin layer. A layer of aromatic polyamide can be formed by a coat of a solution of aromatic polyamide, followed by removing the solvent.

In the case where a thermotropic liquid crystal polymer is used, on the other hand, a molten polymer is formed into a layer form by extruding from a die, and the layer is placed on the metallic thin film to the resin layer. However, there is a problem with the thermotropic liquid crystal polymer in that it is remarkably oriented upon extruding to form anisotropy in the resin layer.

The invention also provides an apparatus for forming an image containing: an image carrier, in which a latent image caused by differences in electrostatic potential is formed on an endless surface thereof; a developing unit visualizing the latent image by attaching toner powder containing a thermoplastic resin to the image carrier; an intermediate transfer member, on which a toner image formed on the image carrier is temporarily transferred; and a transferring and fixing unit heating the toner image on the intermediate transfer member and press-fixing the molten toner image on a recording medium, wherein the intermediate transfer member is an endless belt produced according to the invention, and the transferring and fixing unit contains an electromagnetic induction coil arranged to face the intermediate transfer member.

In the apparatus for forming an image, a magnetic flux penetrating the metallic thin film or the metallic foil of the intermediate transfer member is formed by applying an alternating current to the electromagnetic induction coil, whereby an eddy current is formed in the metallic thin film or the metallic foil. Accordingly, the metallic thin film or the metallic foil develops heat to effectively heat the toner image, which is thus melted. The molten toner image is applied to a recording medium under pressure, so as to simultaneously conduct transfer and fixing, whereby an image with good conditions can be obtained.

While the intermediate transfer member is repeatedly heated by the eddy current in the foregoing process, the metallic thin film or the metallic foil is firmly integrated with the heat-resistant resin film to exhibit sufficient durability against peeling.

As described in the foregoing, in the process for producing a heat-resistant resin film or an endless belt according to the invention, a metallic thin film is firstly formed on a substrate, and then a layer of a heat-resistant resin is formed to be closely attached thereto. Therefore, the heat-resistant resin layer is firmly attached to the metallic thin film to easily obtain an accumulated body with good integration.

The entire disclosure of Japanese Patent Application No. 2000-167835 filed on Jun. 5, 2000 including specification, claims, drawings and abstract is incorporated herein by reference in its entirety.

What is claimed is:

1. A process for producing an endless belt having a metallic thin film, comprising the steps of:

forming a metallic thin film on an inner surface of a cylindrical substrate;

forming a layer containing a heat-resistant resin thereon; and peeling an accumulated body containing the heat-resistant resin layer and the metallic thin film from the substrate.

2. The process for producing an endless belt having a metallic thin film as claimed in claim 1, wherein a surface of the substrate is coated with a releasing agent before forming the metallic thin film.

3. The process for producing an endless belt having a metallic thin film as claimed in claim 1, wherein a surface of the metallic thin film is subjected to a chemical etching treatment before forming the heat-resistant resin layer.

4. The process for producing an endless belt having a metallic thin film as claimed in claim 1, further comprising the step of:

applying a compression force to the accumulated body of the metallic thin film and the layer of heat-resistant resin peeled off from the substrate in a thickness direction thereof.

5. The process for producing an endless belt having a metallic thin film as claimed in claim 1, wherein the step of forming the layer containing a heat-resistant resin comprises the steps of:

forming a layer of a polyamide acid solution on the metallic thin film; and subjecting the layer to imidization by heating to form a film member containing polyimide.

6. The process for producing an endless belt having a metallic thin film as claimed in claim 1, wherein the step of forming the layer of a heat-resistant resin comprises the steps of:

placing a polyamide acid solution in an interior of the cylindrical substrate;

rotating the cylindrical substrate in a circumferential direction to make the solution be a layer on the metallic thin film; and subjecting the solution to imidization by heating to form a film member containing polyimide.

7. The process for producing an endless belt having a metallic thin film as claimed in claim 1, wherein the step of forming the layer of a heat-resistant resin comprises the steps of:

placing a polyamide acid solution in an interior of the cylindrical substrate;

rotating the cylindrical substrate in a circumferential direction to make the solution be a layer on the metallic thin film; and subjecting the solution to imidization by heating to form a film member containing polyimide, and wherein a porous film of a fluorine resin or a nonwoven fabric of a heat-resistant resin is arranged to closely attach to an inner surface of the substrate before forming the layer of the polyamide acid solution.

8. The process for producing an endless belt having a metallic thin film as claimed in claim 1, wherein the step of forming the layer of a heat-resistant resin comprises the steps of:

forming a layer of a polymer solution of aromatic polyamide on the metallic thin film; and removing a solvent contained in the solution.

9. The process for producing an endless belt having a metallic thin film as claimed in claim 1, wherein the step of forming the layer of a heat-resistant resin comprises the steps of:

placing a polyamide acid solution of aromatic polyamide in an interior of the cylindrical substrate; and rotating the cylindrical substrate in a circumferential direction.

10. The process for producing an endless belt having a metallic thin film as claimed in claim 1, wherein the step of forming the metallic thin film comprises the step of:

conducting electroplating or electroless plating on an inner surface of the cylindrical substrate.

11. The process for producing an endless belt having a metallic thin film as claimed in claim 1, wherein the step of forming the metallic thin film comprises the step of:

attaching a metallic foil on an inner surface of the cylindrical substrate.

12. The process for producing an endless belt having a metallic thin film as claimed in claim 1, further comprising the step of:

forming a layer of a heat-resistant resin on an outer surface of the accumulated body of the metallic thin film and the layer of heat-resistant resin peeled off from the substrate.

13. A process for producing an endless belt, comprising the steps of:

forming a metallic thin film on an inner surface of a drum;

forming a layer containing a heat-resistant resin on the inner surface of the drum;

separating an accumulated layer containing the metallic thin film and the heat-resistant resin layer from the inner surface of the drum.

14. The process according to claim 13, wherein the inner surface of the drum is coated with a releasing agent before forming the metallic thin film.

15. The process according to claim 1, wherein the inner surface of the metallic thin film is subjected to a chemical etching treatment before forming the heat-resistant resin layer.

16. The process according to claim 13, further comprising the step of applying a compression force to the accumulated body of the metallic thin film and the layer of heat-resistant resin peeled off from the inner surface of the drum in a thickness direction thereof.

17. The process according to claim 13, wherein the step of forming the layer containing a heat-resistant resin comprises the steps of:

forming a layer of a polyamide acid solution on the metallic thin film; and subjecting the layer to imidization by heating to form a film member containing polyimide.

18. The process according to claim 13, wherein the step of forming the layer of a heat-resistant resin comprises the steps of:

placing a polyamide acid solution in an inner surface of the drum;

rotating the drum in a circumferential direction to make the solution be a layer on the metallic thin film; and subjecting the solution to imidization by heating to form a film member containing polyimide.

19. The process according to claim 13, wherein the step of forming the layer of a heat-resistant resin comprises the steps of:

placing a polyamide acid solution in the inner surface of the drum;

rotating the drum in a circumferential direction to make the solution be a layer on the metallic thin film, and subjecting the solution to imidization by heating to form a film member containing polyimide, and wherein a porous film of a fluorine resin or a nonwoven fabric of a heat-resistant resin is arranged to closely attach to the inner surface of the drum before forming the layer of the polyamide acid solution.

20. The process according to claim 13, wherein the step of forming the layer of a heat-resistant resin comprises the steps of:

forming a layer of a polymer solution of aromatic polyamide on the metallic thin film; and removing a solvent contained in the solution.

21. The process according to claim 13, wherein the step of forming the layer of a heat-resistant resin comprises the steps of:
   placing a polymer solution of aromatic polyamide in the inner surface of the drum; and
   rotating the drum in a circumferential direction.

22. The process according to claim 13, wherein the step of forming the metallic thin film comprises the step of:
   conducting electroplating or electroless plating on the inner surface of the drum.

23. The process according to claim 13, wherein the step of forming the metallic thin film comprises the step of:
   attaching a metallic foil on the inner surface of the drum.

24. The process according to claim 13, further comprising the step of:
   forming a layer of a heat-resistant resin on an outer surface of the accumulated body of the metallic thin film and the layer of heat-resistant resin and peeling off an accumulated body from the inner surface of the drum.

* * * * *